United States Patent [19]

Nakao et al.

[11] Patent Number: 5,128,315
[45] Date of Patent: Jul. 7, 1992

[54] SUPERCONDUCTING DEVICE AND METHOD OF PRODUCING SUPERCONDUCTING THIN FILM

[75] Inventors: Masao Nakao; Ryohkan Yuasa; Hideki Kuwahara, all of Tsukuba; Atsuo Mizukami, Kashiwa, all of Japan

[73] Assignee: Sanyo Electric Co., Ltd., Osaka, Japan

[21] Appl. No.: 303,933

[22] Filed: Jan. 30, 1989

[30] Foreign Application Priority Data

Feb. 2, 1988 [JP] Japan .................... 63-23332

[51] Int. Cl.$^5$ ................ H01L 39/24; C23C 14/34
[52] U.S. Cl. .................. 505/1; 204/192.24; 505/731; 505/782
[58] Field of Search ............ 204/192.24; 505/1, 816, 505/818, 819, 701, 731, 782

[56] References Cited

U.S. PATENT DOCUMENTS 4,880,771 11/1989 Cava et al. ................... 505/1
4,959,347 9/1990 Kobayashi et al. ........... 505/1

OTHER PUBLICATIONS

B. Oh et al., *Appl. Phys. Lett.*, vol. 51, No. 11, Sep. 1987, pp. 852-854.
M. A. Subramanian et al., *Science*, vol. 239, pp. 1015-1017 (Feb. 26, 1988).
R. Dagan, *Chem. and Eng. News*, Feb. 1, 1988, p. 5.
H. Maeda et al., "A New High $T_c$ Oxide Superconductor Without a Rare Earth Element".
D. Stipp, *Wall Street Journal*, Jul. 9, 1987, pp. 1 and 23.
A. K. Cheetham et al., *Nature*, vol. 333, May 5, 1988, p. 21.
J. P. Locquet et al., *Solid State Communications*, vol. 66, No. 4, pp. 393-395 (1988).
H. Koinuma et al., *Jap. J. Appl. Phys.*, vol. 27, No. 3, Mar. 1988, pp. L376-L377.
M. Nakao et al., *Jap. J. Appl. Phys.*, vol. 27, No. 3, Mar. 1988, pp. L378-L380.
B. T. Sullivan et al., *Appl. Phys. Lett.*, vol. 52, No. 23, Jun. 1988, pp. 1992-1994.
S. J. Lee, *Appl. Phys. Lett.*, vol. 51, No. 15, Oct. 1987, pp. 1194-1196.
T. Aida et al., *Jap. J. Appl. Phys.*, vol. 26, No. 9, Sep. 1987, pp. L1489-L1491.

*Primary Examiner*—Aaron Weisstuch
*Attorney, Agent, or Firm*—Darby & Darby

[57] ABSTRACT

The superconducting device according to the present invention is provided with a superconducting thin film of the Bi-Sr-Ca-Cu oxide deposited on a substrate thereof. Consequently, the device can be produced at a low cost because no rare earth elements are required.

The superconducting thin film according to the present invention is formed by sputtering onto a substrate from a Bi-Sr-Ca-Cu oxide target, followed by annealing in an oxidizing atmosphere. In this way, it is possible to produce a superconducting thin film of the Bi-Sr-Ca-Cu oxide in a simple way by using an ordinary sputtering apparatus. In this method, it is preferable that a MgO substrate be used and the optimum annealing temperature is about 880°C.

8 Claims, 4 Drawing Sheets

SUPERCONDUCTING DEVICE AND METHOD OF PRODUCING SUPERCONDUCTING THIN FILM

BACKGROUND OF THE INVENTION

Field of the Invention

The present invention relates to a superconducting device provided with a superconducting thin film of an oxide, specifically Bi-Sr-Ca-Cu oxide, and a method of producing the superconducting thin film.

SUMMARY OF THE INVENTION

The present invention has been achieved in such a circumstance. The superconducting device according to the present invention is provided with a superconducting thin film of Bi-Sr-Ca-Cu oxide deposited on a substrate.

A first object of the present invention is to provide a superconducting device at a low cost since rare earth elements are not required.

In the method of the present invention, a superconducting think film is prepared by sputtering on a substrate from a Bi-Sr-Ca-Cu outside target, followed by annealing in an oxidizing atmosphere.

A second object of the present invention is to provide a method of producing a superconducting thin film using an ordinary sputtering apparatus.

A third object of the present invention is to provide a method of producing a superconducting thin film easily are in a simple way.

A forth object of the present invention is to provide a method of producing a superconducting thin film using an MgO substate.

A fifth object of the present invention is to provide a method of producing a superconducting thin film with an accurate composition ratio without subjecting the substrate to a forced heat treatment in the sputtering process.

A sixth object of the present invention is to provide a method of producing superconducting thin film with a higher critical temperature by carrying out annealing at about 880° C.

The above and further objects and features of the invention will more fully be apparent from the following detailed description with accompanying drawings.

DESCRIPTION OF THE PREFERRED EMBODIMENTS

The preferred embodiments of the present invention will now be described.

The superconducting device according to the present invention has a superconducting thin film of Bi-Sr-Ca-Cu oxide deposited on a substrate. Here the substrate is considered to be other substrate itself or an insulation layer, or a buffer layer on an active layer formed on the substate. In the superconducting device according to the present invention, no rare earth metals are required. Consequently, the device can be produced at a low cost.

According to the present invention, a superconducting thin film of the Bi-Sr-Ca-Cu oxide type is prepared by RF (radio-frequency) magnetron sputtering from a sintered target. This sintered target is made by a solid-state reaction of high-purity reagents, as will be mentioned below.

Four kinds of high-purity reagents (35.0 g of $Bi_2O_3$ of a purity of 99.999%, 22.1 g of $SrCO_3$, 15.0 g of $CaCO_3$ and 23.9 g of CuO, of a purity of 99.99%) are added to an organic solvent such as methanol, ethanol or the like, and is stirred with a stirrer. Then, after evaporating the organic solvent, the reagents are ground into powder in a mortar. This powder is calcined in an electric furnace at 875° C. for an hour. This calcined powder is put into a mold, pressed into a pellet at a pressure of 760 $kgf/cm^2$. This pellet is then sintered at 880° C. in air for an hour to obtain a sintered target. A 10 cm diameter 0.5 cm thick sintered $Bi_1Sr_1Ca_1Cu_2O_x$ target is preferably obtained.

The steps for preparing a superconducting thin film of $Bi_1Sr_1Ca_1Cu_2O_x$ on the substrate from the target thus obtained in a RF magnetron sputtering apparatus are next described.

Figure 1:
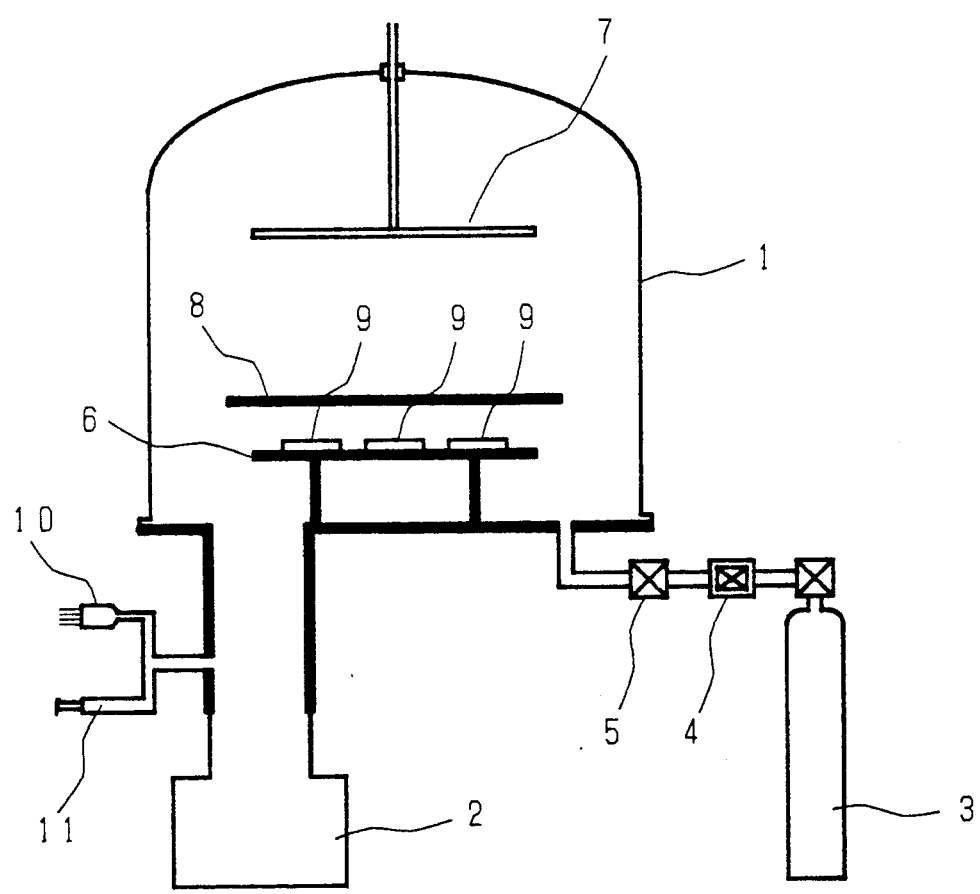
FIG. 1 is a schematic view of a sputtering apparatus used for carrying out the method of producing a superconducting thin film according to the present invention.

FIG. 1 shows the structure of a RF magnetron sputtering apparatus, wherein numeral 1 denotes a bell bar to which an exhaust system 2 is linked. Also communicating with the bell jar 1 is an argon gas cylinder 3 for supplying argon gas into the bell jar 1 via a variable leak valve 4 and shut off valve 5. In the bell jar 1, an anode 6 is grounded, and (100) MgO substrates 9 are put on the anode 6 for depositing superconducting thin films on the surfaces thereof. The cathode 7 is made of the sintered ($Bi_1Sr_1Ca_1Cu_2O_x$) target mentioned above. Applied to the cathode 7 is a negative thigh voltage, of 2.3 kV for example. A typical frequency of 13.56 MHz used for RF sputtering is applicable here. The distance between electrodes 6 and 7 is typically 4.5 cm. Numerals 10 and 11 in the figure denote a high vacuum gauge and a low vacuum gauge, respectively, Thin films which are 0.5 to 5 $\mu$ thick are applied to the MgO substrated 9 by supplying argon ga of a purity of 99.999% with a pressure of 3.0 to 300 mTorr from the argon gas cylinder 3 into the bell jar 1. At the same time sputtering is carried out at a sputtering power of 100 to 250 W. During this sputtering process, the MgO substrates 9 are subjected to a natural heat treatment p to 10° to 150° C. in the bell jar 1. It is preferred that the sputtering should be carried out under a natural heat treatment condition, and it must be absolutely avoided that the MgO substrates 9 be actively heated to higher temperature of about 600° C., for example, for such a heat treatment causes a deviation in the composition ratio of the superconducting thin film to be produced.

As an example, the deposition rate if 270 Å/min. under conditions where the argon gas pressure is 30.0 mTorr and the sputtering power is 150 W. The reason why the sputtering power is set within the above-mentioned range is that if the power is too small, the discharge will be unstable and, to the contrary, if the output is too great, there is a danger of the sintered target being cracked. Oxygen incorporation is small in the deposited films, which are generally insulating in character, and an X-ray diffraction pattern analysis shows it is amorphous. Its surface is mirror-smooth.

The MgO substrates on which thin films are formed are placed in an electric furnace, and annealing is carried out in an oxygen atmosphere with a flow rate of 2l/min, at 880° C. for one hour. This is followed by cooling to prepare superconducting think films of $Bi_1Sr_1Ca_1Cu_2O_x$ on the MgO substrates 9. In this case, the heating rate if 1° C./sec., while the cooling rate is −20° C./sec. in the electric furnace.

Figure 2:
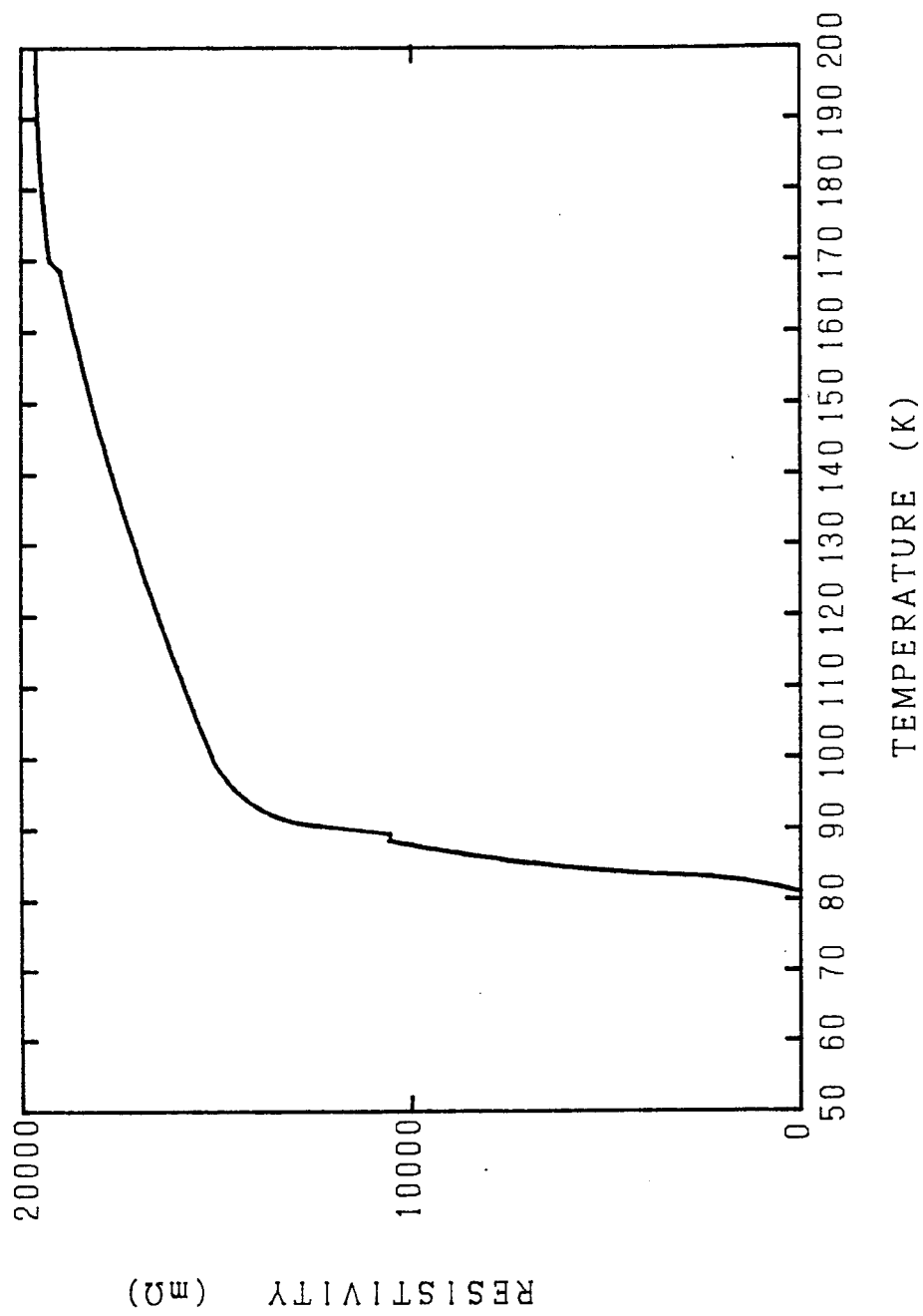
FIG. 2 is a chart showing the temperature dependence of resistivity of a superconducting think film obtained by the present invention.

FIG. 2 is a chart showing resistivity vs. temperature curve for a superconducting thin film of Bi-Sr-Ca-Cu oxide. The temperature dependence of the film resistivity is measured by the standard four-probe technique using pressed indium contacts. The temperature is measured by a Au+0.07%Fe-Chromel thermocouple. The applied constant current density ranges from $0.5A/cm^2$ to $5A/cm^2$. The zero-resistivity temperature is 80KL(−193° C.) for a film on a MgO substrate, and a resistance anomaly is observed around 110K, which suggests that a superconducting phase of 110K class is contained in part of the formed film.

Figure 3:
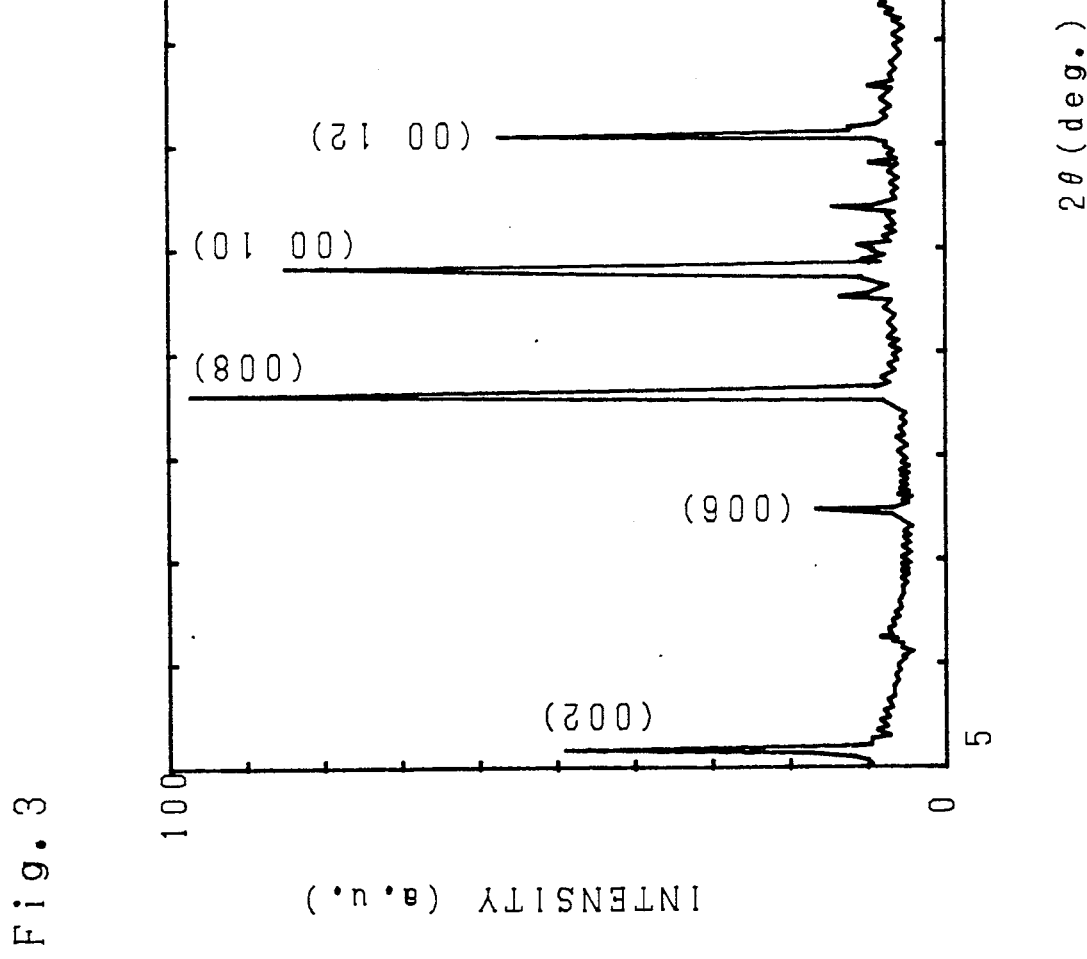
FIG. 3 is a X-ray diffraction pattern of a superconducting thin film obtained by the present invention.

FIG. 3 shows an X-ray diffraction pattern of a superconducting thin film of a Bi-Sr-Ca-Cu oxide obtained by the method according to the present invention, wherein periodic peaks of strong (100l) reflections corresponding to =2, 6, 8, 10, 12, 16, 20. are observed. Consequently, it is understood that the crystal of the superconducting thin film is highly oriented with the c-axis nearly perpendicular to the substrate 9 and that this results agrees well with the characteristics of a single crystal. The lattice parameter along the c-axis s 30.76Å.

On the other hand, the Meissner effect in a superconducting think film obtained by the method of the present invention shows that a diamagnetic state is observed at 80K.

Figure 4:
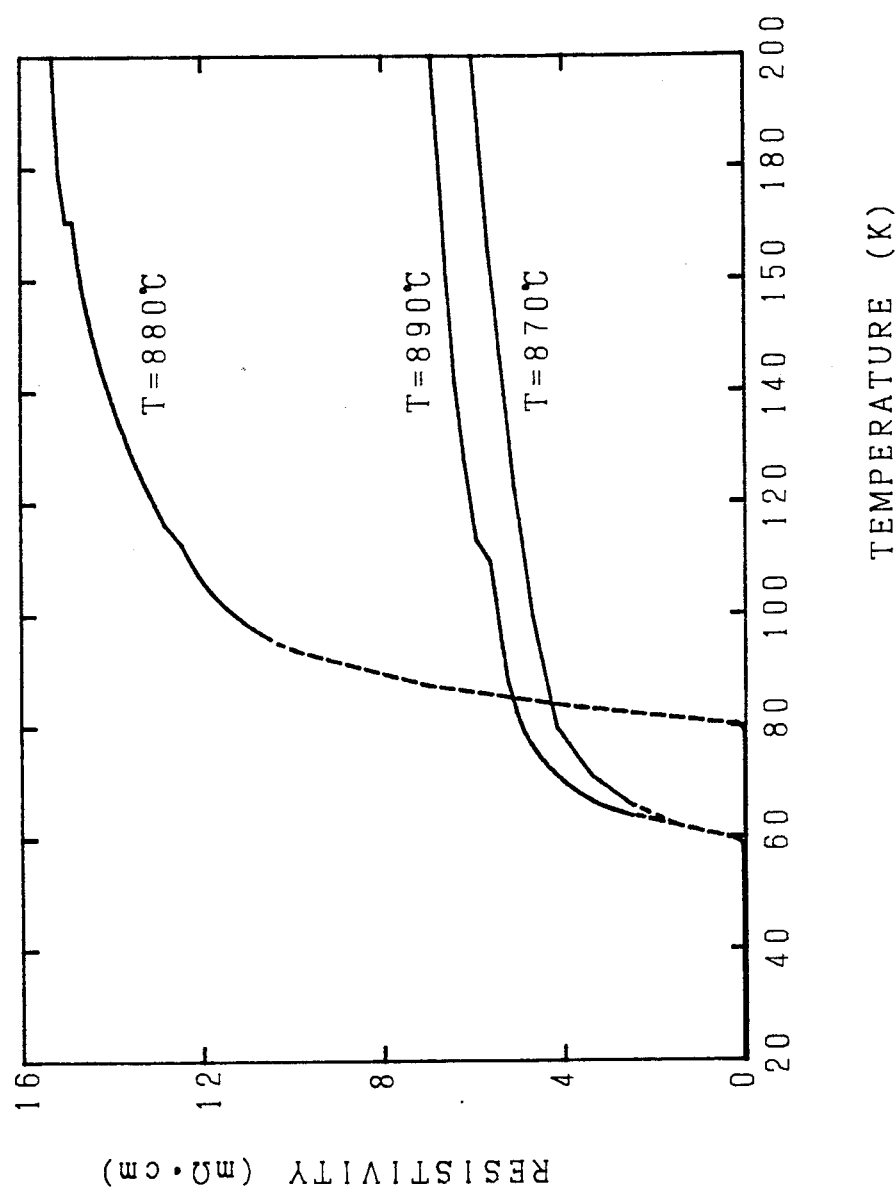
FIG. 4 is a chart showing temperature dependence of resistivities of superconducting thin films produced at varied annealing temperatures.

FIG. 4 shows the temperature resistivity-characteristics of superconducting thin films produced by the method as mentioned above with variation in annealing temperature and the remaining conditions being unchanged. The perconducting properties for annealing temperature T=870° C. and 890° C. are shown as well as that in the above mentioned embodiment (where the annealing temperature T=880° C.). A superconducting thin film prepared at the annealing temperature T=880° C. indicates the highest zero-resistivity temperature.

When the superconducting thin films are prepared on (100) and (110) $SrTiO_3$ substrates instead of (100) MgO substrates by the same method as in the above-mentioned embodiment, they have an inferior superconducting property in contrast to the films prepared on MgO substrates. It is believed that this is due to the diffusion of Sr and Ti into the superconducting thin film to be produced. Furthermore, the superconducting thin films produced on sapphire substrates does not exhibit any superconducting property. From the description above, it is obviously seen that a MgO substrate is the most excellent substrate for use.

It is also possible to produce superconducting thin films by using $GaF_2$-coating or $CaF_2$-coated Si substrates, instead of MgO substrates. Another suitable substrate is YSZ (YTTRIA-stabilized $ZMO_2$). This is disclosed in copending application Ser. No. 303,932, filed Jan. 30, 1989, entitled "Superconducting Thin Film Member and Method of Producing Same", which is assigned to the same assignee.

As this invention may be embodied in several forms without departing from the spirit of essential characteristics thereof, the present embodiment is therefore illustrative and not restrictive, since the scope of invention is defined by the appended claims rather than by the description preceding them, and all changes that fall within the meets and bounds of the claims, or equivalence of such meets and bounds thereof are therefore intended to be embraced by the claims.

What is claimed is:

1. A superconducting device provided with a superconducting thin film of a Bi-Sr-Ca-Cu oxide deposited on a substrate, said thin film being oriented along the c-axis, the lattice parameter along the c-axis being 30.76Å.

2. A superconducting device as set froth in claim 1, wherein said substrate is a MgO. substrate.

3. A method of producing a superconducting thin film, comprising:
    forming a thin film of Bi-Sr-Ca-Cu oxide on a substrate by sputtering from a target of said oxide, said thin film formed with a c-axis orientation with the lattice parameter along the c-axis being 30.76Å, and
    subjecting said substrate with the thin film thereon to annealing in an oxidizing atmosphere.

4. A method of producing a superconducting thin film as set forth in claim 3, wherein said substrate is an MgO substrate.

5. A method of producing a superconducting thin film as set forth in claim 3, wherein said substrate material is one selected from the group consisting of an $SrTiO_3$ substrate, an YSZ (Yttria-stabilized $ArO_2$) substrate and a Si substrate coated with $BaF_2$ or $CaF_2$.

6. A method of producing a superconducting thin film as set forth in claim 3, wherein the temperature of said substrate is increased during said sputtering only by natural heat produced during said sputtering step.

7. A method of producing a superconducting thin film as set forth in claim 3, wherein said oxidizing atmosphere is an oxygen atmosphere.

8. A method of producing a superconducting thin film as set forth in claim 3, wherein the annealing temperature is about 880° C.

* * * * *